United States Patent
Safa et al.

(10) Patent No.: US 8,964,437 B2
(45) Date of Patent: Feb. 24, 2015

(54) ENERGY DISSIPATING DEVICE FOR DC POWER SUPPLIES

(71) Applicant: Keysight Technologies, Inc., Minneapolis, MN (US)

(72) Inventors: Peyman Safa, Loveland, CO (US); Michael J. Benes, Loveland, CO (US); Marko Vulovic, Loveland, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 45 days.

(21) Appl. No.: 13/741,593

(22) Filed: Jan. 15, 2013

(65) Prior Publication Data

US 2014/0198549 A1    Jul. 17, 2014

(51) Int. Cl.
*H05K 7/20* (2006.01)
*H02M 1/00* (2006.01)

(52) U.S. Cl.
CPC .................................. *H05K 7/2089* (2013.01)
USPC ............................ 363/141; 363/146; 363/147

(58) Field of Classification Search
USPC ......................................... 363/141, 146, 147
See application file for complete search history.

(56) References Cited

U.S. PATENT DOCUMENTS

| | | | |
|---|---|---|---|
| 4,982,107 A | 1/1991 | Fayfield | |
| 5,504,361 A | 4/1996 | Blossfeld | |
| 5,596,637 A | 1/1997 | Pasetti et al. | |
| 6,368,064 B1 * | 4/2002 | Bendikas et al. | 417/2 |
| 7,002,332 B2 | 2/2006 | Chen et al. | |
| 7,038,437 B2 | 5/2006 | Kenny et al. | |
| 7,436,200 B1 | 10/2008 | Jacobsen et al. | |
| 7,999,530 B2 | 8/2011 | Sullivan et al. | |
| 8,102,678 B2 * | 1/2012 | Jungreis | 363/21.03 |
| 8,212,400 B2 | 7/2012 | Wu et al. | |
| 2008/0129377 A1 | 6/2008 | You et al. | |
| 2008/0204958 A1 | 8/2008 | Shearon et al. | |
| 2009/0146626 A1 | 6/2009 | Benes | |
| 2012/0299375 A1 * | 11/2012 | Saez-Zamora et al. | 307/9.1 |

FOREIGN PATENT DOCUMENTS

| | | |
|---|---|---|
| EP | 1406373 A2 | 4/2004 |
| JP | 2007267508 A | 10/2007 |
| JP | 2011100597 A | 5/2011 |

\* cited by examiner

*Primary Examiner* — Emily P Pham (57) ABSTRACT

An energy dissipating device configured to connect to a power supply and to dissipate excess energy from a direct current (DC) rail in response to a change in power supply settings or operating characteristics. The energy dissipating device is connected to the DC rail, which conducts current generated by an AC/DC converter to at least one DC/DC converter. When power demand to the DC/DC converter is reduced, the DC/DC converter generates a supplemental current surge on the DC rail. A rail current monitor monitors the current level on the DC rail and generates the DC rail power signal indicative of the supplemental current surge level generated by the at least one DC/DC converter. The supplemental surge current is used to control dissipative elements connected across the DC rail to modulate a current sink path across the DC rail to dissipate the excess energy from the DC rail.

20 Claims, 4 Drawing Sheets

ENERGY DISSIPATING DEVICE FOR DC POWER SUPPLIES

TECHNICAL FIELD

The present invention relates generally to power supplies, and particularly to power supplies that provide excess power dissipation.

BACKGROUND

Power supplies for electrical equipment are available as DC power supplies that provide a user the capability of switching between different voltage or current settings. DC power supplies of this type are generally available in apparatuses or systems that may be used to test electrical equipment at different voltage or current settings. The different voltage or current settings are implemented by converting a main DC voltage at one high level to the lower user-selected DC voltage. The main DC voltage may be provided on a DC rail powered by an AC/DC converter and, in some implementations, available for more than one DC/DC converter to tap into for the main DC power used to down-convert to the user-selected DC level.

One problem that arises in operation of user-adjustable DC power supplies is excess energy that remains at the DC power output when the DC power level is switched to a lower level. The excess energy is typically stored on a filter capacitor typically provided at the DC supply output. The DC supply output may also be connected to a load that may have energy stored up from operating at a higher DC setting when the power switch occurs. A similar problem may also occur when any DC power supply experiences a sudden change in its load. The excess energy must be dissipated safely to avoid damage to the load or, possibly to the AC/DC converter or the DC/DC converter.

One solution is to connect dissipative elements across the output of the DC power supply to discharge the output filters. The dissipative elements are preferably designed to switch rapidly in order to achieve fast discharge times. Using this approach, the dissipative elements, or cells, all of the energy stored in the converter's output filter as well as the customer's load could be dissipated while lowering the output voltage to the value set by the user. Sub-systems that employed this solution were known as down-programmers. Down-programmers are typically designed in accordance with the ratings and specifications of the power supply model in which they are to operate. The need to conform to the characteristics of the power supply includes the need to seamlessly integrate with converter's control circuits in order for the output to sufficiently track the settings of the user.

Some DC/DC converters in DC power supplies are designed with synchronous rectification and are thus able to conduct current in both directions. This capability allowed power supplies to discharge output capacitors in a very short time and provided the converters with a small static current sinking capability. Energy from the output capacitors or the user's load may be directed back on to the power rail and used by all other systems using the power rail. The AC/DC converter supplying the DC power to the rail is not bi-directional. When net positive energy is directed to the power rail, the DC voltage could climb positive. In order to prevent this, a subsystem known in the art as an automatic down-programmer ("ADP") may be added to dissipate the excess net energy.

The ADP is simpler than typical down-programmers since it does not require any custom design for each power supply model. In addition, since the ADP dissipates the balance of the energy sent back to the rail after conversion and usage by other subsystems, it is not typically required to dissipate as much energy. The ADP is able to sink high currents for short periods of time, which is suitable for discharging output capacitors. It also serves as a static load when one is needed. However, the load capacity of the ADP is limited thermally in typical implementations because of airflow capacity. The ADP's thermal capacity is limited by the need for space for large heat sinks. The ADP is also affected by the proximity to other large power-dissipating components. In some implementations, the ADP affects precision measurement or control circuitry in the instrument. These issues reduce the sinking capability of the ADP to a fraction of the power sourcing capability of the power supply instrument.

In view of the foregoing, there is an ongoing need for methods of apparatuses for dissipating a more substantial amount of the power sourcing capability of the power supply instrument. There is also a need for methods and apparatuses that are easily configurable for operation with different power supplies.

SUMMARY

To address the foregoing problems, in whole or in part, and/or other problems that may have been observed by persons skilled in the art, the present disclosure provides methods, processes, systems, apparatus, instruments, and/or devices, as described by way of example in implementations set forth below.

In an example implementation, an energy dissipating device is provided. The energy dissipating device includes a direct current (DC) rail input connected across a DC rail in a power supply. The DC rail conducts DC current generated by an AC/DC converter to at least one DC/DC converter. The at least one DC/DC converter is configured to generate a supplemental current surge on the DC rail when the at least one DC/DC converter absorbs power from a load on the at least one DC/DC converter. A dissipater control input receives a DC rail power signal from a rail current monitor. The rail current monitor monitors a current level on the DC rail and generates the DC rail power signal indicative of the supplemental current surge level generated by the at least one DC/DC converter. A plurality of dissipative elements connected across the DC rail at the DC rail input provides a current sink path across the DC rail. The plurality of dissipative elements is configured to modulate the current sink path in proportion with the supplemental current surge level received at the dissipater control input.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood by referring to the following figures. The components in the figures are not necessarily to scale, emphasis instead being placed upon illustrating the principles of the invention. In the figures, like reference numerals designate corresponding parts throughout the different views.

DETAILED DESCRIPTION

Figure 1:
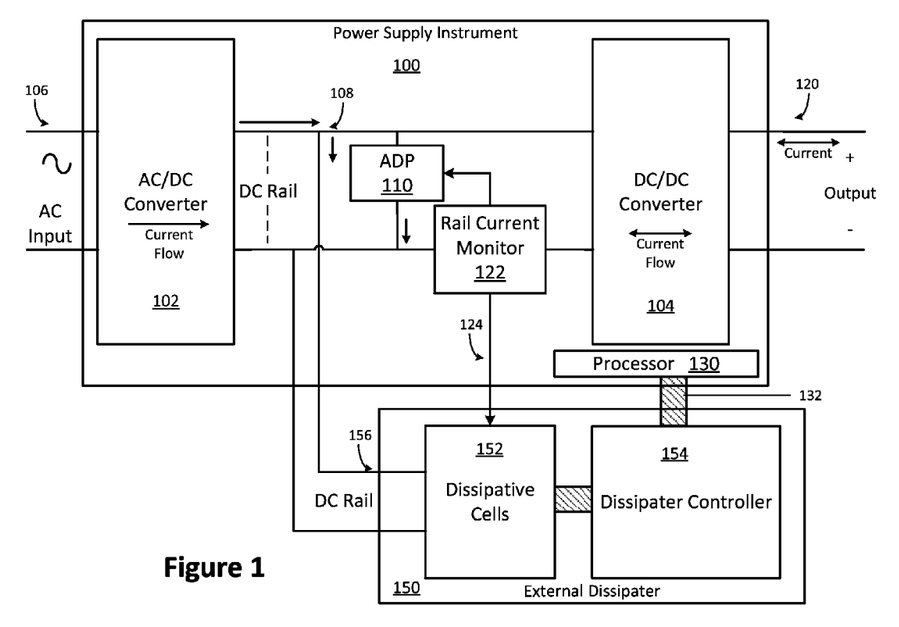
FIG. 1 is a schematic diagram an example of a power supply that uses an external energy dissipating device to dissipate excess power from the DC rail.

FIG. 1 is an example of a power supply 100 that uses an external energy dissipating device 150 to dissipate excess power from a DC rail 108 during a power level switch. The external energy dissipating device 150 is an example implementation of an energy dissipating device for providing excess power dissipation up to the power sourcing capability of the power supply 100. The power supply 100 includes an AC/DC converter 102 that generates a source DC power output for a DC/DC converter 104. The AC/DC converter 102 includes circuits for rectifying AC power received at an AC input 106 and generating the source DC power at the DC rail 108. The AC/DC converter 102 is configured to generate DC current in one direction as indicated in FIG. 1. The DC/DC converter 104 uses the source DC power to generate a DC supply at a supply output 120.

The DC supply at the supply output 120 is generated at a user selected voltage or current level. The DC/DC converter 104 may have or be connected to user interface devices, such as knobs or rotary switches, or push buttons or digital inputs, which may be used by the user to set the power supply to provide a specific voltage level or a current level. In normal operation, the DC/DC converter 104 includes power circuits that step the DC voltage down to the voltage level selected by the user. It is noted that while the power supply 100 may operate in a constant voltage or constant current source, this description refers to examples as operating as a constant voltage source for purposes of illustrating examples. This description is not intended to be limiting implementations to being either constant current or constant voltage sources.

The DC/DC converter 104 may be configured to have bi-directional current capabilities as indicated in FIG. 1. When the power supply 100 experiences a power demand change that leaves excess energy at the supply output 120. The bi-directional capability of the DC/DC converter 104 allows the DC/DC converter 104 to conduct current generated by excess energy at the filters across the supply output 120 back on to the DC rail 108. Bi-directional DC/DC converters 104 typically perform a limited current sinking function when the excess energy is left on the supply output 120, and reverse current flow to transfer excess energy on to the DC rail 108. One advantage to transferring the excess energy on to the DC rail 108 is that the excess energy may be used by other DC/DC converters 104 that may be connected to the DC rail 108.

An automatic down programmer ("ADP") 110 is provided across the DC rail 108 to dissipate excess energy from the DC/DC converter 104 when the DC power demand is reduced resulting in excess energy on the supply output 120. The DC/DC converter 104 generates a DC voltage at the supply output 120 at the voltage setting selected by the user. During operation, the user may switch the voltage setting to a lower voltage, or switch in a different load at the supply output 120. When the voltage setting is lowered suddenly, the energy stored by the power supply capacitance at the supply output 120 maintains a higher voltage level until the energy is dissipated. The DC/DC converter 104 may sink some of the excess energy and conduct the rest on to the DC rail 108. If the excess energy is sufficiently high, with no other way to dissipate the charge, it is possible that the AC/DC converter 102 would have to absorb the excess energy, which may damage the AC/DC converter 102 since the AC/DC converter 102 is not configured to conduct current in both directions. The ADP 110 in FIG. 1 is provided to dissipate at least some of the excess energy.

The ADP 110 operates by responding to a current sense signal from a rail current monitor 122. The rail current monitor 122 senses the current level on the DC rail 108 and generates a supplemental current surge signal when an excess energy state on the DC rail 108 is detected. It is noted that the power supply 100 as described thus far may be a conventional power supply that uses the ADP 110 for excess power dissipation. Typically conventional power supplies of this type suffer from limitations in their capacity to dissipate excess energy.

The power supply 100 in FIG. 1 includes connections to the external energy dissipating device 150 to extend the power dissipation capacity to closer to the full power sourcing capability of the power supply 100. The external energy dissipating device 150 includes a DC rail input 156 to receive connection to the DC rail 108, a plurality of dissipative elements 152, and a dissipater controller 154. The external energy dissipating device 150 may receive a DC rail power signal 124 indicative of a supplemental current surge and use the DC rail power signal 124 to modulate the current sinking by the dissipative elements 152. The rail current monitor 122 may generate the DC rail power signal 124 from sensing the current on the DC rail 108. In an example implementation, the DC rail power signal 124 is used by both the ADP 110 and the plurality of dissipative elements 152 to detect the current on the DC rail 108. In another implementation, the DC rail power signal 124 may be generated by a condition where the excess energy is excessive for the ADP 110. The DC rail power signal 124 is used to modulate the plurality of dissipative elements 152 to increasingly dissipate energy from the DC rail 108 as the amount of excess energy on the DC rail 108 increases.

The external energy dissipating device 150 may be advantageously added to operate with existing power supplies that are unable to dissipate power up to their power sourcing capability. The power supply 100 may be retrofitted to operate with the external energy dissipating device 150 by adding taps to the DC rail 108 and to the DC rail power signal 124, or by including software upgradability. The external energy dissipating device 150 may be configured with hardware and software components, such as for example, the dissipater controller 154, that provide discovery functions, supervision functions, and other functions when connected to the power supply 100. For example, the power supply 100 in FIG. 1 includes a power supply controller 130, which may be used to provide overall control over the operation of the power supply 100. The power supply controller 130 may be connected to a communications bus 132 to permit interaction with the external energy dissipating device 150. The communication between the power supply controller 130 and the external energy dissipating device 150 may be carried out via a communications interface, which may communicate signals, commands, and any other information according to a protocol. The power supply controller 130 may be configured to apply a sinking limit to the current sink capacity of the ADP 110 when operating without the external energy dissipating device 150. The external energy dissipating device 150 may be enclosed in a housing. The housing may provide terminals, such as, for example, a first input terminal and second input terminal for connecting the DC rail 108, a dissipater control terminal for connecting the rail current monitor 122 to the dissipater control input, and a bus interface connector for connecting the communications interface between the power supply controller 130 and the external energy dissipating device 150 to the communications bus 132. The housing and the terminals or connectors on the housing may be implemented using any suitable enclosing structure and terminal or connector hardware known to those of ordinary skill in the art.

Figure 2:
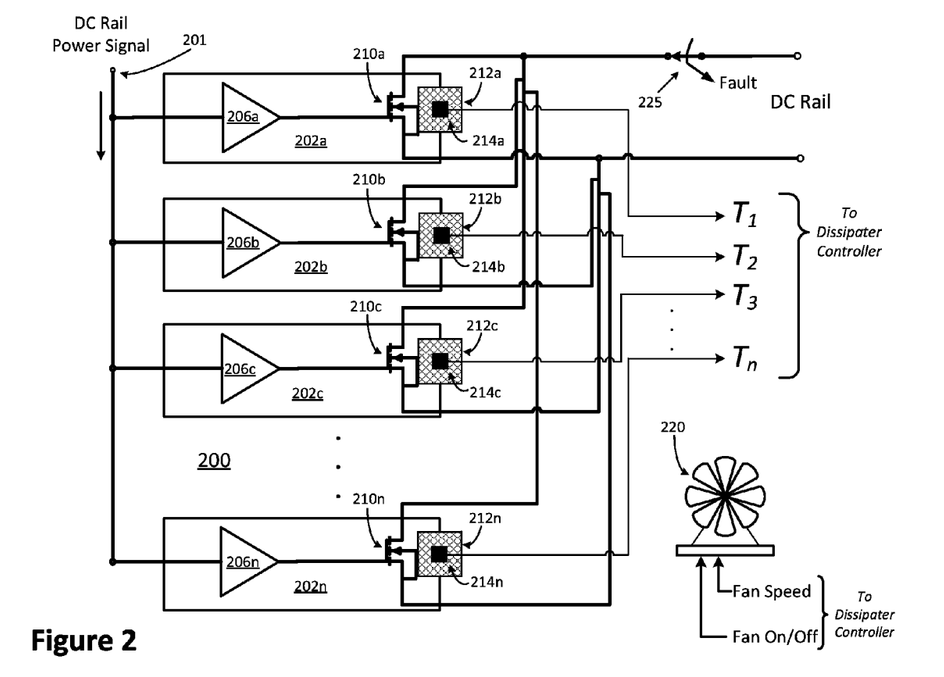
FIG. 2 is a schematic diagram of an example of a dissipative cells sub-system that may be used in the external energy dissipating device in FIG. 1.

FIG. 2 is a schematic diagram of an example of a dissipative cells sub-system 200 that may be used in the external energy dissipating device 150 in FIG. 1. The dissipative cells subsystem 200 in FIG. 2 includes n dissipating cells 202a-202n. Each of the n dissipating cells 202a-202n includes a dissipative element 210a-210n, a heat sink 212a-212n, and a temperature sensor 214a-214n. The dissipative cells sub-system 200 includes a dissipater control input 201 to receive the DC rail power signal 124 (in FIG. 1). Each of the plurality of dissipative elements 210a-210n is connected to provide a current path across the DC rail 108 in response to the current level at the DC rail power signal 124.

The dissipative elements 210a-210n may be implemented using any variable load cell having devices such as a FET or variable resistor, or any other suitable high-power conducting device. The example illustrated in FIG. 2 illustrates an example using a FET as the dissipative element 210a-210n where the FET is biased to operate substantially linearly to increase current flow through the FET in response to an increase in current from the DC rail power signal 124. The dissipating cells 202a-202n each include a driver 206a-206n to provide a signal at the gate of the FET that modulates the current permitted to sink through the dissipative elements 210a-210n. The dissipative elements 210a-210n may be suitably packaged to be in thermal contact with the heat sinks 212a-212n. The temperature sensors 214a-214n may be any suitable thermal sensor capable of indicating a temperature measurement with an electrical signal. The temperature measurements of the temperature sensors 214a-214n may be output and communicated along a signal communications path to the dissipater controller 154 as shown in FIG. 2.

FIG. 2 indicates that the dissipative cells sub-system 200 includes up to n dissipative elements 210a, 210b, 210c, and 210n. The number n may be any suitable number. When there is excess energy on the DC rail 108 due to a change in power demand, the supplemental current surge level may be indicated by the DC rail power signal 124 input at the dissipater control input 201. If only a small amount is indicated by the supplemental current surge level, the dissipative elements 210a, 210b, 210c, and 210n are modulated to sink a current level that is appropriate for the small amount. As the amount of supplemental current surge level increases toward the power sourcing capacity of the power supply 100, the dissipative elements 210a, 210b, 210c, and 210n are driven to increase the current level in the current path across the DC rail 108 to the 'on' state, thereby dissipating the excess energy on the DC rail 108.

It is noted that each of the dissipating cells 202a-202n may include components for performing functions according to the needs of specific implementations that are not shown in FIG. 2. For example, components may be added to protect against reverse polarity at the DC rail 108; capacitors may be added to maintain DC levels adequately smooth; resistors may be used to bias the drivers 206a-206n and the dissipative elements 210a-210n to ensure proper modulation of the current sink across the DC rail 108; and other components may be added as needed for specific functions.

The dissipative cells sub-system 200 includes control signal and data signal connections to the dissipater controller 154. The dissipater controller 154 may be any suitable processor or controller (with or without a digital processor) that may be configured to monitor a plurality of operating conditions, and to take corrective or remedial action in the event a fault condition is detected. In an example implementation as shown in FIG. 2, the control and data signals may include a fault condition/reset signal and a dissipative element temperature $T_1$, $T_2$, $T_3$, and $T_n$ for reach of the plurality of dissipative elements 210a-210n. A fan 220 may be included in the housing of the external energy dissipating device 150, or in another suitable location, to provide cooling airflow when a substantial amount of heat is generated during operation. The temperature of the dissipative elements 210a-210n may be monitored by the dissipater controller 154. The dissipater controller 154 may use the dissipative element temperatures to determine if the external energy dissipating device 150 should be shutdown, or if the temperature condition should be indicated, or if the fan 220 should be turned on. If the fan 220 is turned on, the dissipater controller 154 may control the fan speed via the control signals (fan speed signal and fan on/off signal) at the fan 220 as shown in FIG. 2. The external energy dissipating device 150 may be shutdown when a thermal overload condition is detected by, for example, triggering a shutdown switch 225, which would disconnect the dissipative elements 210a-210n from the DC rail 108.

Figure 3:
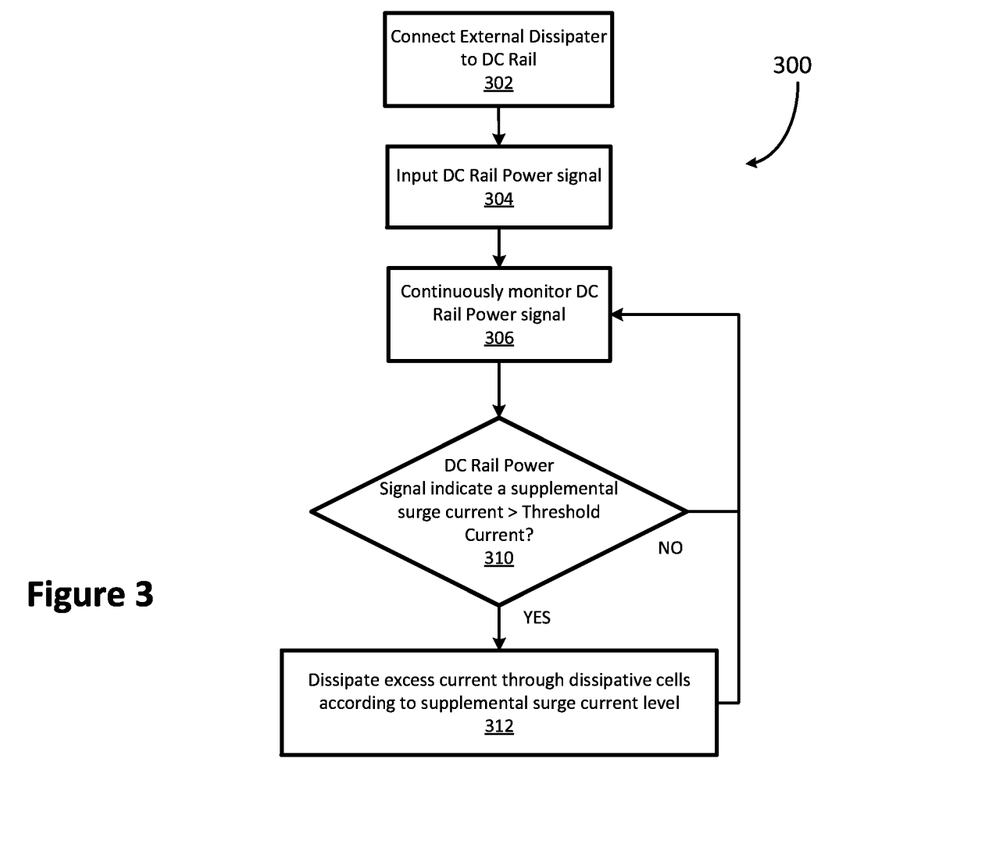
FIG. 3 is a flowchart illustrating operation of an example method for dissipating energy from a DC rail.

FIG. 3 is a flowchart illustrating operation of an example method 300 for dissipating energy from a DC rail 108. The method 300 may be performed by any suitable processor or controller, such as the dissipater controller 154 that is configured to provide the hardware and software capability for the functions to be performed. The method 300 may be performed for any suitable power supply 100 (in FIG. 1) that has either been designed for use with the external energy dissipating device 150 (in FIG. 1) or retrofitted for use with the external energy dissipating device 150 or designed for use with the external energy dissipating device 150 as an accessory. At step 302 of the method 300, the external energy dissipating device 150 is connected to the power supply 100 at the DC rail 108. Additional connections include a connection for communicating the DC rail power signal 124 (in FIG. 1) to the dissipater control input 201, and optionally, the communications bus 132 (in FIG. 1) to a communications interface on the external energy dissipating device 150.

Figure 4:
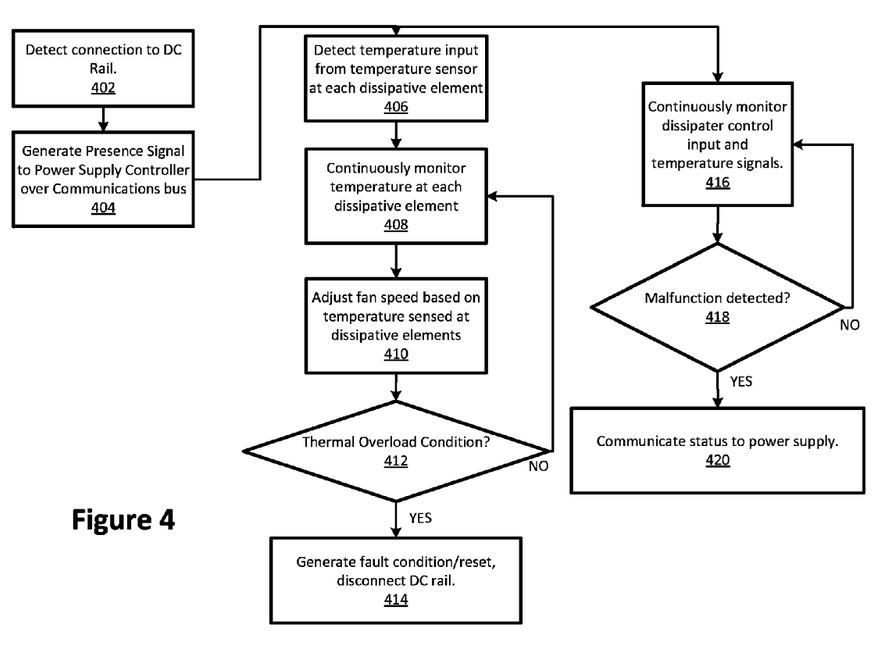
FIG. 4 is a flowchart illustrating operation of the dissipater controller.

When the external energy dissipating device 150 has been connected, the power supply 100 may include functions for integrating operation of the external energy dissipating device 150 with the power supply 100, some of which are described with reference to FIG. 4. At step 304, the external energy dissipating device 150 inputs the DC rail power signal to detect any supplemental surge current. At step 306, the DC rail power signal is continuously monitored for any supplemental surge current. At decision block 310, the method 300 determines whether the supplemental surge current has exceeded a threshold. The check at decision block 310 may be for a threshold current level that indicates a supplemental surge current level that exceeds the capability of the DC/DC converter 104 to sink and the demand for current from any other DC/DC converter 104 that may be connected to the DC rail 108. Above the threshold current level, it is possible that the AC/DC converter 102 would be required to sink the excess current, which is a task for which the AC/DC converter 102 is not designed to perform. It is noted that the functions performed by any of the steps and decision blocks may be performed by active or passive circuitry configured to provide signal levels that trigger the necessary functions. In some example implementations, one or more of the functions or decision blocks may be performed with a processor.

If at decision block 310, the threshold current is exceeded, the n dissipating cells 202a-202n (in FIG. 2) are modulated to sink current across the DC rail 108 as indicated in step 312. The extent to which the dissipating cells 202a-202n sink current across the DC rail 108 may be in proportion to the amount of excess energy as indicated by the supplemental surge current level relative to the maximum sourcing capacity of the power supply 100. It is noted that the modulation of the current sink at the dissipating cells 202a-202n need not be strictly linear. The modulation may be adjusted for the needs of the specific implementation.

At step 312, once the excess energy has been dissipated, the DC rail power signal 124 may return to a level that restores the dissipating cells 202a-202n to sink a low level of current, or even to the open state. Control then returns to step 306 to continue monitoring of the DC rail power signal.

The external energy dissipating device 150 includes the dissipater controller 154, which performs functions that further enhances operation of the power supply 100. The dissipater controller 154 may obtain power for operation from the DC rail 108. As indicated above, the power supply 100 may be a conventional power supply 100 that is retrofitted to perform with the dissipater controller 154. The retrofit may include upgraded software, or inclusion of a software product that supports the use of the external energy dissipating device 150. FIG. 4 is a flowchart illustrating operation of functions performed by the dissipater controller 154 that enhance the operation of the power supply 100.

One function that would be advantageous for the conventional power supply 100 is an external energy dissipating device 150 presence detection function. As noted above, the power supply 100 may operate using the ADP 110 for excess power dissipation, and may therefore include triggers or sinking limits that may shutdown the power supply 100 and/or the ADP 110 when certain excess power limits are exceeded. When the external energy dissipating device 150 is connected to the DC rail 108, the dissipater controller 154 detects the connection to the DC rail 108 at step 402. At step 404, the dissipater controller 154 may communicate a presence signal to the power supply 100 at the communications bus 132. In response, the power supply controller 130 detects the presence signal indicating that an external energy dissipating device 150 has been discovered, and removes the sinking limits to take advantage of the full sinking capacity provided by the external energy dissipating device 150.

At step 406, the dissipater controller 154 performs under normal operation and detects the temperature of the dissipative elements 210a-210n (in FIG. 2) at control inputs $T_1$ through $T_n$. At step 408 the temperature of the heat sinks 212a-212n for all of the dissipative elements 210a-210n is continuously monitored. At step 410, the dissipater controller 154 may monitor a fan (such as the fan 220 in FIG. 2) by adjusting the fan speed based on the temperature sensed. At decision block 412, the temperature of the dissipative elements 210a-210n is analyzed to determine if a thermal overload condition has been reached. If the decision block 412 has detected a thermal overload, the dissipater controller 154 may initiate a variety of responsive actions such as for example, generating a fault/reset condition that is communicated to the plurality of dissipative elements 152, force a disconnect of the DC rail 108 from the dissipative elements 152, and communicate the fault condition to the power supply 100.

The dissipater controller 154 may perform monitoring tasks in parallel. For example, as shown in FIG. 4, the temperature monitoring functions may be performed in parallel with other tasks such as those indicated in steps 416-420, which relate to the monitoring of control signals and temperature sensor inputs. At step 416, the dissipater controller 154 continuously monitors control signals to ensure operability, such as the dissipater control input 201, which detects the supplement surge current. Other signals, such as the temperature sensor inputs, may also be monitored. Hardware may be added to enable the monitoring of the operability of the inputs. The monitoring may also entail an exchange of information with the power supply 100. At decision block 418, the dissipater controller 154 determines of a malfunction exists. If a malfunction of one of the control signals is detected, the status may be communicated to the power supply 100 as shown in FIG. 4. For example, the dissipater controller 154 may determine that the dissipater control input 201 (in FIG. 2) is not operating (for example, by detecting a short or open condition predetermined to be abnormal). The dissipater controller 154 may communicate the malfunction of the dissipater control input to the power supply 100. The power supply 100 may in response re-establish the sinking limits in place before the external energy dissipating device 150 was detected.

The external energy dissipating device 150 described above with reference to FIGS. 1-4 is an example of an energy dissipating device that may be used to provide excess power sinking up to the power sourcing capacity of the power supply 100. It is to be understood that the energy dissipating device is not limited to operating as an external energy dissipating device 150, which has been described to illustrate its modularity and functional diversity relative to the power supply 100 to which it can be connected. An example energy dissipating device may also operate as a subsystem that is integrated with the power supply.

It will be understood that various aspects or details of the invention may be changed without departing from the scope of the invention. Furthermore, the foregoing description is for the purpose of illustration only, and not for the purpose of limitation—the invention being defined by the claims.

What is claimed is:

1. An energy dissipating device comprising:
a DC rail input configured to connect across a DC rail in a power supply, where the DC rail conducts DC current generated by an AC/DC converter to at least one DC/DC converter, where the at least one DC/DC converter is configured to generate a supplemental current surge on the DC rail when the at least one DC/DC converter absorbs power from a load on the at least one DC/DC converter;
a dissipater control input configured to receive a DC rail power signal from a rail current monitor, where the rail current monitor is configured to monitor a current level on the DC rail and to generate the DC rail power signal indicative of a supplemental current surge level generated by the at least one DC/DC converter; and
a plurality of dissipative elements connected across the DC rail at the DC rail input, each one of the plurality of dissipative elements configured to provide a current sink path across the DC rail, where the plurality of dissipative elements are configured to modulate the current sink path in proportion with the supplemental current surge level received at the dissipater control input.

2. The energy dissipating device of claim 1 further comprising:
a plurality of heat sinks, each heat sink in thermal contact with a corresponding one of the plurality of dissipative elements.

3. The energy dissipating device of claim 1 further comprising:
a dissipater controller configured to monitor a plurality of operating conditions in the energy dissipating device.

4. The energy dissipating device of claim 3 further comprising:
a plurality of heat sinks, each heat sink in thermal contact with a corresponding one of the plurality of dissipative elements;
a temperature sensor on each of the plurality of heat sinks, the temperature sensors connected on a signal communications path to the dissipater controller to provide a temperature measurement for each of the plurality of dissipative elements.

5. The energy dissipating device of claim 3 further comprising:
a fan configured to provide cooling airflow to the plurality of dissipative elements at a fan speed indicated by a fan speed signal;
where the fan is connected to the dissipater controller on a signal communications path to receive the fan speed signal generated by the dissipater controller.

6. The energy dissipating device of claim 4 where the plurality of operating conditions includes a dissipative element temperature for the plurality of dissipative elements, and where the dissipater controller is configured to detect a thermal overload based on the dissipative element temperature for the plurality of dissipative elements and to shutdown operation of the energy dissipating device when the thermal overload is detected.

7. The energy dissipating device of claim 3 further comprising:
a communications interface configured to connect to a power supply controller over a communications bus, the power supply controller configured to control operation of the AC/DC converter, the DC rail, and the at least one DC/DC converter as a power supply instrument, and to integrate operation of the energy dissipating device with the power supply instrument.

8. The energy dissipating device of claim 7 where:
the power supply instrument comprises an automatic down programmer connected to the rail current monitor and configured with a current sink capacity to sink the DC rail when the rail current monitor detects the supplemental current surge level;
the power supply controller enables a sinking limit to the current sink capacity of the automatic down programmer;
the dissipater controller in the energy dissipating device generates a presence signal on the communications bus to permit discovery by the power supply controller; and
the power supply controller removes the sinking limit from the automatic down programmer when the energy dissipating device is discovered.

9. The energy dissipating device of claim 1 further comprising:
a housing configured to contain the plurality of dissipative elements, to provide a first input terminal and second input terminal for connecting the DC rail to the DC rail input, and to provide a dissipater control terminal for connecting the rail current monitor to the dissipater control input.

10. The energy dissipating device of claim 7 further comprising:
a housing configured to contain the plurality of dissipative elements, to provide a first input terminal and second input terminal for connecting the DC rail to the DC rail input, to provide a dissipater control terminal for connecting the rail current monitor to the dissipater control input, and to provide a bus interface connector for connecting the communications bus interface to the communications bus.

11. A method for dissipating energy from a DC rail in a power supply configured to provide power generated by an AC/DC converter to at least one DC/DC converter, the DC/DC converter configured to generate a supplemental current surge on the DC rail when the at least one DC/DC converter absorbs power from a load, the method comprising:
connecting a plurality of dissipative elements external to the power supply across the DC rail to provide a current sink path across the DC rail at each dissipative element;
inputting a DC rail power signal at a dissipater control input from a rail current monitor, where the rail current monitor detects a current level on the DC rail and generates the DC rail power signal indicative of a supplemental current surge level generated by the at least one DC/DC converter; and
modulating the current sink path by controlling the plurality of dissipative elements in proportion with the supplemental current surge level received at the dissipater control input.

12. The method of claim 11 further comprising:
detecting a dissipative element temperature for each dissipative element; and
controlling a fan speed of a fan in accordance with the detected dissipative element temperatures.

13. The method of claim 12 further comprising:
shutting down operation of the plurality of dissipative elements when thermal overload is detected.

14. A DC power supply comprising:
a DC rail configured to supply DC current;
an AC/DC converter configured to generate the DC current on the DC rail;
at least one DC/DC converter connected to the DC rail to receive the DC current, the at least one DC/DC converter configured to generate a supplemental current surge on the DC rail when the at least one DC/DC converter absorbs power from a load on the at least one DC/DC converter;
a rail current monitor configured to monitor a current level on the DC rail and to generate a DC rail power signal indicative of a supplemental current surge level generated by the at least one DC/DC converter; and
an energy dissipating device comprising:
a DC rail input configured to connect across a DC rail,
a dissipater control input configured to receive the DC rail power signal from a rail current monitor, and
a plurality of dissipative elements connected across the DC rail at the DC rail input, each one of the plurality of dissipative elements configured to provide a current sink path across the DC rail, where the plurality of dissipative elements are configured to modulate the current sink path in proportion with the supplemental current surge level received at the dissipater control input.

15. The DC power supply of claim 14 where the energy dissipating device further comprises:
a dissipater controller configured to monitor a plurality of operating conditions in the energy dissipating device.

16. The DC power supply of claim 15 where the energy dissipating device further comprises:
a plurality of heat sinks, each of the plurality of heat sinks in thermal contact with a corresponding one of the plurality of dissipative elements;
a temperature sensor on each of the plurality of heat sinks, the temperature sensors connected on a signal communications path to the dissipater controller to provide a temperature measurement for each dissipative element.

17. The DC power supply of claim 15 where the energy dissipating device further comprises:
   a fan configured to provide cooling airflow to the plurality of dissipative elements at a fan speed indicated by a fan speed signal;
   where the fan is connected to the dissipater controller on a signal communications path to receive the fan speed signal generated by the dissipater controller.

18. The DC power supply of claim 15 where the plurality of operating conditions includes a dissipative element temperature for the plurality of dissipative elements, and where the dissipater controller is configured to detect a thermal overload based on the dissipative element temperatures and to shutdown operation of the energy dissipating device when the thermal overload is detected.

19. The DC power supply of claim 14 further comprising:
   a power supply controller configured to control operation of the AC/DC converter, the DC rail, and the at least one DC/DC converter, and to integrate operation of the energy dissipating device into the DC power supply;
   where the energy dissipating device further comprises:
      a communications bus interface configured to connect to the power supply controller over a communications bus.

20. The DC power supply of claim 19 further comprising:
   an automatic down programmer connected to the rail current monitor and configured with a current sink capacity to sink the DC rail when the rail current monitor detects the supplemental current surge level;
   where:
      the power supply controller applies a sinking limit to the current sink capacity of the automatic down programmer;
      a dissipater controller in the energy dissipating device generates a presence signal on the communications bus to permit discovery by the power supply controller; and
      the power supply controller removes the sinking limit from the automatic down programmer when the energy dissipating device is discovered.

* * * * *